United States Patent
Tang

(10) Patent No.: US 10,366,911 B2
(45) Date of Patent: Jul. 30, 2019

(54) CARRIER SUBSTRATE FOR CARRYING AN OLED IN MANUFACTURING PROCESS AND MANUFACTURING METHOD FOR THE SAME

(71) Applicant: Wuhan China Star Optoelectronics Technology Co., Ltd., Wuhan, Hubei (CN)

(72) Inventor: Fan Tang, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 294 days.

(21) Appl. No.: 15/504,330

(22) PCT Filed: Dec. 26, 2016

(86) PCT No.: PCT/CN2016/112157
§ 371 (c)(1),
(2) Date: Feb. 16, 2017

(87) PCT Pub. No.: WO2018/112991
PCT Pub. Date: Jun. 28, 2018

(65) Prior Publication Data
US 2018/0226286 A1    Aug. 9, 2018

(30) Foreign Application Priority Data
Dec. 20, 2016    (CN) .......................... 2016 1 1181218

(51) Int. Cl.
*H01L 21/683* (2006.01)
*C23C 14/04* (2006.01)
(Continued)

(52) U.S. Cl.
CPC ............. *H01L 21/6833* (2013.01); *B32B 7/12* (2013.01); *B32B 27/08* (2013.01); *B32B 27/308* (2013.01);
(Continued)

(58) Field of Classification Search
CPC .............................. H01L 21/6833; B32B 7/12
See application file for complete search history.

(56) References Cited

U.S. PATENT DOCUMENTS

2007/0216274 A1* 9/2007 Schultz ................ H05K 1/0204
313/46
2012/0106111 A1* 5/2012 Mazzochette .......... B82Y 30/00
361/783
(Continued)

FOREIGN PATENT DOCUMENTS

CN    102036496 A    4/2011
CN    105121576 A    12/2015
(Continued)

*Primary Examiner* — Scott Bauer
(74) *Attorney, Agent, or Firm* — Andrew C. Cheng

(57) ABSTRACT

A carrier substrate for carrying an OLED in manufacturing process is disclosed. The carrier substrate includes a substrate and an attracted layer disposed on a surface of the substrate, wherein the attracted layer includes a resin layer and multiple magnetic nanoparticles distributed in the resin layer. A manufacturing method for the same is also disclosed. When manufacturing an OLED, the attracted layer receives the attraction force provided by the attraction body so that the deformation of the substrate for carrying an OLED in manufacturing generating by drooping because of gravity force can be canceled out or decreased in order to avoid a shadow effect and a color mixing.

8 Claims, 2 Drawing Sheets

(51) Int. Cl.
*H01L 51/56* (2006.01)
*B32B 27/08* (2006.01)
*B32B 27/30* (2006.01)
*B32B 7/12* (2006.01)
*H01L 21/50* (2006.01)
*H01L 51/00* (2006.01)
*C23C 14/24* (2006.01)

(52) U.S. Cl.
CPC .............. *C23C 14/04* (2013.01); *H01L 21/50* (2013.01); *H01L 51/0096* (2013.01); *H01L 51/56* (2013.01); *C23C 14/24* (2013.01); *Y02E 10/549* (2013.01)

(56) References Cited

U.S. PATENT DOCUMENTS

| | | | | |
|---|---|---|---|---|
| 2014/0312314 | A1* | 10/2014 | Khachatryan | H01L 51/003 257/40 |
| 2016/0018694 | A1* | 1/2016 | Zhou | G02F 1/13394 349/106 |
| 2016/0083626 | A1* | 3/2016 | Ebe | H01F 1/37 324/207.17 |
| 2018/0226609 | A1* | 8/2018 | Li | H01L 51/003 |

FOREIGN PATENT DOCUMENTS

| | | | | |
|---|---|---|---|---|
| CN | 105593953 | A | 5/2016 | |
| CN | 106191783 | A | 12/2016 | |
| WO | WO-2015168556 | A1 * | 11/2015 | ............. H01B 1/124 |

* cited by examiner

CARRIER SUBSTRATE FOR CARRYING AN OLED IN MANUFACTURING PROCESS AND MANUFACTURING METHOD FOR THE SAME

BACKGROUND OF THE INVENTION

1. Field of the Invention

The present invention relates to an organic light-emitting technology field, and more particularly to a carrier substrate for carrying an OLED in manufacturing process and a manufacturing method for the same.

2. Description of Related Art

In the recent years, Organic Light Emitting Diode (OLED) is a new flat display product at home and abroad. The OLED display device has properties of self-luminous, wide viewing angle (up to 175°), short response time (1 μs), high luminous efficiency, wide color gamut, low operation voltage (3~10V), thin panel (less than 1 mm), capable of manufacturing a large size, capable of manufacturing flexible panel and simple in process. Besides, the OLED device has a potential for low cost.

In the manufacturing process of OLED, a glass substrate will be bent down in an evaporation machine because of the gravity force so that the glass substrate is deformed. Besides, along with larger and thinner in the size of the glass substrate, the deformation amount will become larger, especially for a flexible substrate. The roll-to-roll and the printing technology are not mature currently. In the situation that cannot perform a mass production, the manufacturing of a flexible substrate is usually coating a polymer solution on a surface of the glass substrate and formed the flexible substrate after a curing reaction. In the manufacturing process for OLED, the shrinking of the flexible substrate on the glass substrate after curing and film forming will aggravate the deformation of the glass substrate. From an edge location to a center location of the glass substrate, the deformation amount will gradually increase. After the glass substrate is deformed, the adhering of the glass substrate and a mask under the function of magnet will cause a situation that the glass substrate and the mask are not adhered closely so as to generate a shadow effect and a color mixing.

SUMMARY OF THE INVENTION

In order to solve the problems of the conventional art, the purpose of the present invention is to provide a carrier substrate for carrying an OLED in manufacturing process in order to decrease the deformation amount and manufacturing method for the same.

According to one aspect of the present invention, providing a carrier substrate for carrying an OLED in manufacturing process, comprising: a substrate; and an attracted layer disposed on a surface of the substrate, wherein the attracted layer includes a resin layer and multiple magnetic nanoparticles distributed in the resin layer.

Wherein, a distribution density of the magnetic nanoparticles is gradually increased from an edge location to a center location of the resin layer.

Wherein, each magnetic nanoparticle is a ferromagnetic nanoparticle and the resin layer is made of polyimide resin.

Wherein, the carrier substrate further includes a property changing layer coated on and surrounds a surface of each magnetic nanoparticle, and the property changing layer is used for increasing integration degree between the resin layer and the magnetic nanoparticles.

Wherein, a material of the property changing layer is a silane coupling agent.

According to another aspect of the present invention, providing a manufacturing method for a carrier substrate for carrying an OLED in manufacturing process comprising steps of: providing a substrate; coating a resin solution on a first surface of the substrate; spraying multiple magnetic nanoparticles in the coated resin solution; and heating the resin solution being sprayed with the multiple magnetic nanoparticles in order to cure the resin solution and form a resin layer having the multiple magnetic nanoparticles.

Wherein, in the step of spraying multiple magnetic nanoparticles in the coated resin solution, a spraying density of the magnetic nanoparticles is gradually increased from an edge location to a center location of the resin solution.

Wherein, a property changing layer is coated on and surrounds a surface of each magnetic nanoparticle, and the property changing layer is used for increasing an integration degree between the resin layer and the magnetic nanoparticle.

The beneficial effect of the present invention: the deformation of the substrate for carrying an OLED in manufacturing generating by drooping because of gravity force can be canceled out or decreased in order to reduce a shadow effect and avoid color mixing.

BRIEF DESCRIPTION OF THE DRAWINGS

Through following to combine figures to describe in detail, the above, the other purposes, the features and benefits of the exemplary embodiment of the present disclosure will become clearer, wherein.

DETAILED DESCRIPTION OF THE PREFERRED EMBODIMENT

The following content combines with the drawings and the embodiment for describing the present invention in detail. However, many other forms can be used to implement the present invention. Besides, the present invention should not be interpreted to be limit in the specific embodiment described here. On the contrary, the embodiments provided here are used for explaining the operation principle and practical application such that person skilled in the art can under various embodiments of the present invention and various modification suitable for specific applications.

In the figures, in order to illustrate the devices clearly, thickness of the layers and regions are enlarged. A same numeral in the entire specification and figures represents a same device.

Figure 1:
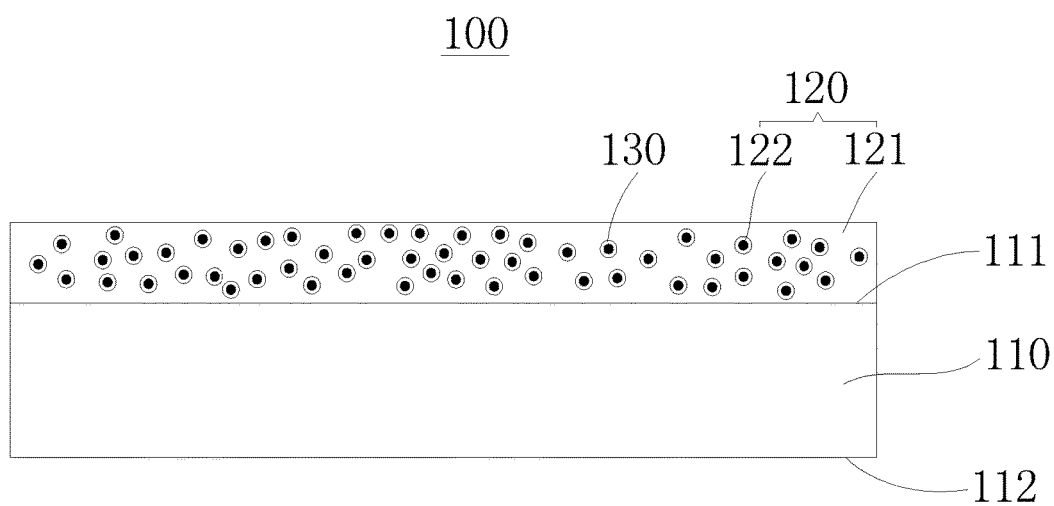
FIG. 1 is a schematic diagram of a carrier substrate for carrying an OLED in manufacturing process according to an embodiment of the present invention.

FIG. 1 is a schematic diagram of a carrier substrate for carrying an OLED in manufacturing process according to an embodiment of the present invention.

With reference to FIG. 1, the carrier substrate 100 for carrying an OLED in manufacturing process includes a substrate 110 and an attracted layer 120.

In the present embodiment, the substrate 110 can be a glass substrate or a resin substrate, but the present invention is not limited. For example, other suitable types of hard substrates. The substrate 110 includes two surfaces disposed oppositely, wherein, one surface is defined as a first surface 111, and the other surface is defined as a second surface 112.

The attracted layer 120 is formed on the first surface 111. As another embodiment of the present invention, the attracted layer 120 can also be formed on the second surface 112. The attracted layer 120 includes a resin layer 121 and multiple magnetic nanoparticles 122 distributed in the resin layer 121.

Furthermore, a thickness of the attracted layer 120 is in a range of 1 μm~100 μm, a diameter of each magnetic nanoparticle 122 is in a range of 1 nm~100 nm, but the present invention is not limited.

Figure 2:
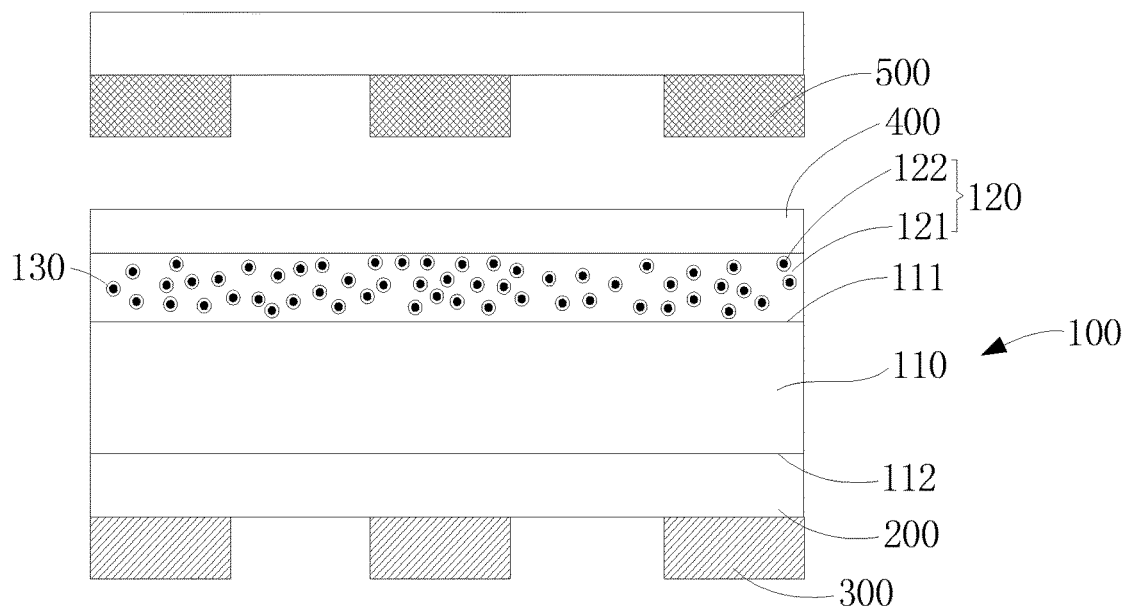
FIG. 2 is a schematic diagram of a carrier substrate that carries a flexible substrate in manufacturing an OLED according to an embodiment of the present invention.

FIG. 2 is a schematic diagram of a carrier substrate that carries a flexible substrate in manufacturing an OLED according to an embodiment of the present invention.

With reference to FIG. 1 and FIG. 2, the first surface 111 of the substrate 110 is provided with the attracted layer 120, and the second surface 112 of the substrate 110 is provided with a flexible substrate 200 and a mask 300. The attracted layer 120 is attached to a cooling plate 400 temporarily. A location of the cooling plate 400 corresponding to the attracted layer 120 is provided with an attraction body 500, and the attraction body 500 provides with attraction force to the attracted layer 120.

As an embodiment of the present invention, the attraction body 500 can be a magnet. Each magnetic nanoparticle 122 can be a ferromagnetic nanoparticle, but the present invention is not limited.

Accordingly, when manufacturing an OLED, the attracted layer 120 receives the attraction force provided by the attraction body 500. The attraction force can entirely or partially cancel out the gravity of the substrate 110 and the flexible substrate 200 in order to reduce the deformation of the substrate 110.

Besides, the resin layer 121 should have a high temperature resistant property. Accordingly, the resin layer 121 in the present embodiment is preferably made of polyimide resin, but the present invention is not limited.

As described in the background of the present application, from an edge location to a center location of the glass substrate, the deformation amount of the glass substrate is gradually increased. With reference to FIG. 1, in order to match the deformation amount at different locations of the substrate 110, preferably in the present embodiment, a distribution density of the magnetic nanoparticles 122 is gradually increased from an edge location to a center location of the resin layer 121. Accordingly, the attraction body 500 has a greater attraction force at the center location of the attracted layer 120 and has a smaller attraction force at the edge location of the attracted layer 120 such that the substrate 110 can maintain flat in a maximum degree.

Here, it should be noted that the number of the attracted layer 120 is not limited as shown in FIG. 1, two or more attracted layers 120 can be stacked on the first surface 111.

Furthermore, the carrier substrate 100 for carrying an OLED in manufacturing process can also include a property changing layer 130. It should be noted that, as another embodiment of the present invention, the property changing layer 130 may not be existed.

The property changing layer 130 can be coated on and surround the surface of each magnetic nanoparticle 122. The property changing layer 130 is used for increasing an integration degree between the resin layer 121 and the magnetic nanoparticles 122. Preferably, the property changing layer 130 can be formed by a silane coupling agent, but the present invention is not limited. For example, the present invention can also use other suitable material which can increase the integration degree between the resin layer 121 and the magnetic nanoparticles 122.

Besides, it should be noted that when two or more attracted layers 120 are disposed on the first surface 111, between adjacent two attracted layers 120, an adhesive layer can be provided. The adhesive layer has a high temperature resistant property. That is, the attracted layers 120 and the adhesive layer are stacked alternately on the first surface 111.

Figure 3:
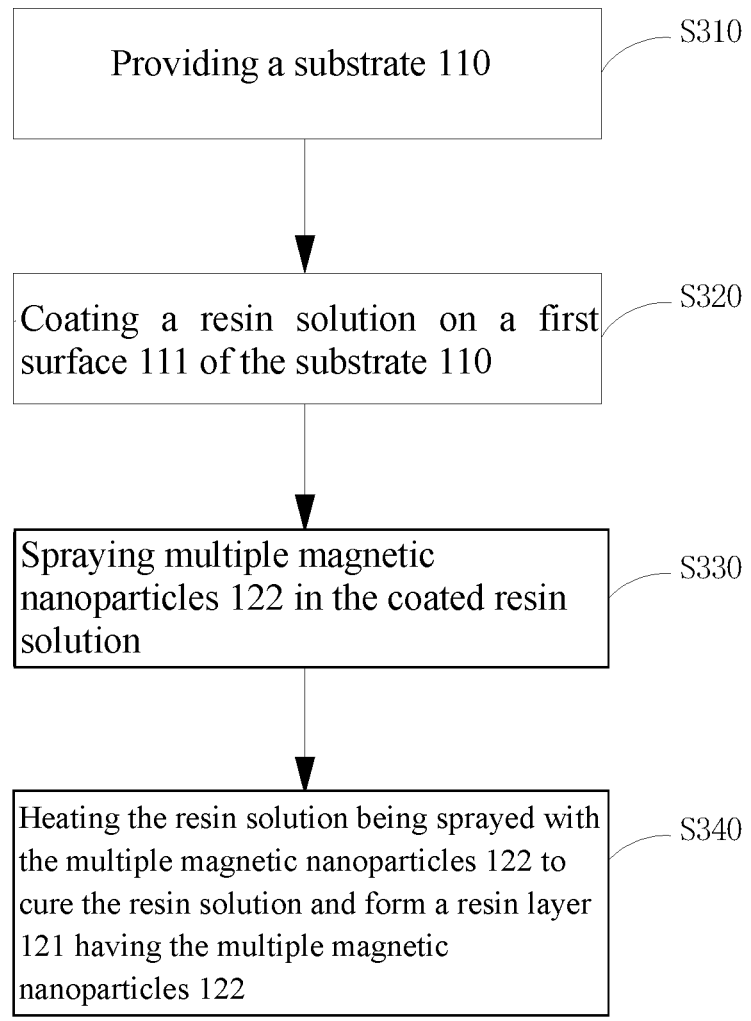
FIG. 3 is a flow chart of a manufacturing method for a carrier substrate for carrying an OLED in manufacturing process according to an embodiment of the present invention.

FIG. 3 is a flow chart of a manufacturing method for a carrier substrate for carrying an OLED in manufacturing process according to an embodiment of the present invention.

With reference to FIG. 1 and FIG. 3, the manufacturing method for a carrier substrate 100 for carrying an OLED according to an embodiment of the present invention includes steps of:

S310: providing a substrate 110.

S320: coating a resin solution on a first surface 111 of the substrate 110.

S330: spraying multiple magnetic nanoparticles 122 in the coated resin solution.

S340: heating the resin solution being sprayed with the multiple magnetic nanoparticles 122 in order to cure the resin solution and form a resin layer 121 having the multiple magnetic nanoparticles 122.

In the step S330, a spraying density of the magnetic nanoparticles 122 is gradually increased from an edge location to a center location of the resin solution (or the resin layer 121).

Furthermore, a property changing layer 130 is coated on and surrounds a surface of each magnetic nanoparticle 122, and the property changing layer 130 is used for increasing an integration degree between the resin layer 121 and the magnetic nanoparticles 122. Preferably, the property changing layer 130 is made of silane coupling agent, but the present invention is not limited. For example, the present invention can also use other suitable material which can increase the integration degree between the resin layer 121 and the magnetic nanoparticles 122.

In summary, according to the embodiment of the present invention, the deformation of the substrate for carrying an OLED in manufacturing generating by drooping because of gravity force can be canceled out or decreased in order to avoid a shadow effect and a color mixing.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A carrier substrate for carrying an OLED in manufacturing process, comprising:
    a substrate; and an attracted layer disposed on a surface of the substrate, wherein the attracted layer includes a resin layer and multiple magnetic nanoparticles distributed in the resin layer;

wherein a distribution density of the magnetic nanoparticles is gradually increased from an edge location to a center location of the resin layer.

2. The carrier substrate according to claim 1, wherein, each magnetic nanoparticle is a ferromagnetic nanoparticle and the resin layer is made of polyimide resin.

3. The carrier substrate according to claim 1, wherein, the carrier substrate further includes a property changing layer coated on and surrounds a surface of each magnetic nanoparticle, and the property changing layer is used for increasing an integration degree between the resin layer and the magnetic nanoparticle.

4. The carrier substrate according to claim 3, wherein, a material of the property changing layer is a silane coupling agent.

5. A manufacturing method for a carrier substrate for carrying an OLED in manufacturing process comprising steps of:

providing a substrate;

coating a resin solution on a first surface of the substrate;

spraying multiple magnetic nanoparticles in the coated resin solution; and heating the resin solution being sprayed with the multiple magnetic nanoparticles in order to cure the resin solution and form a resin layer having the multiple magnetic nanoparticles;

wherein in the step of spraying multiple magnetic nanoparticles in the coated resin solution, a spraying density of the magnetic nanoparticles is gradually increased from an edge location to a center location of the resin solution.

6. The manufacturing method according to claim 5, wherein, each magnetic nanoparticle is a ferromagnetic nanoparticle and the resin layer is made of polyimide resin.

7. The manufacturing method according to claim 5, wherein, a property changing layer is coated on and surrounds a surface of each magnetic nanoparticle, and the property changing layer is used for increasing an integration degree between the resin layer and the magnetic nanoparticle.

8. The manufacturing method according to claim 7, wherein, a material of the property changing layer is a silane coupling agent.

* * * * *